(12) United States Patent
Ibaraki et al.

(10) Patent No.: US 7,477,736 B2
(45) Date of Patent: Jan. 13, 2009

(54) SIMPLE HINGE UNIT CAPABLE OF PROVIDING ELECTRICAL CONNECTION IN AN ELECTRONIC APPARATUS

(75) Inventors: Kazuaki Ibaraki, Tokyo (JP); Masao Higuchi, Tokyo (JP); Haruyuki Harada, Kanagawa (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 1041 days.

(21) Appl. No.: 10/944,599

(22) Filed: Sep. 17, 2004

(65) Prior Publication Data

US 2005/0060842 A1    Mar. 24, 2005

(30) Foreign Application Priority Data

Sep. 19, 2003    (JP) .............................. 2003-328298

(51) Int. Cl.
*H04M 1/00* (2006.01)
(52) U.S. Cl. ................. 379/433.13; 455/575.3
(58) Field of Classification Search ............. 379/433.11–433.13; 455/90.3, 575.1, 575.3, 455/575.4; 16/321, 327, 330
See application file for complete search history.

(56) References Cited

U.S. PATENT DOCUMENTS

| 6,115,886 | A | * | 9/2000 | Fujita | ........................... | 16/330 |
| 6,754,507 | B2 | * | 6/2004 | Takagi | ..................... | 455/550.1 |
| 6,879,337 | B2 | * | 4/2005 | Tatehana et al. | ......... | 348/14.02 |
| 7,245,948 | B2 | * | 7/2007 | Jung et al. | ............... | 455/575.1 |

FOREIGN PATENT DOCUMENTS

| JP | 9-148030 A | 6/1997 |
| JP | 10-290084 A | 10/1998 |
| JP | 11-168289 A | 6/1999 |
| JP | 2000-216567 A | 8/2000 |
| JP | 3145652 B2 | 1/2001 |
| JP | 3220412 B2 | 8/2001 |
| JP | 2002-232535 A | 8/2002 |
| JP | 2002-333012 A | 11/2002 |
| JP | 2003-100410 A | 4/2003 |
| JP | 2003-120654 A | 4/2003 |

* cited by examiner

*Primary Examiner*—Curtis Kuntz
*Assistant Examiner*—Tuan D Nguyen
(74) *Attorney, Agent, or Firm*—Frishauf, Holtz, Goodman & Chick, P.C.

(57) ABSTRACT

In a hinge unit for use in an electronic apparatus, a shaft has a part held by a first member unrotatable and axially unmovable. Around the other part of the shaft, a flexible portion of a circuit board is wound. A second member is rotatable and axially unmovable with respect to the shaft. An intermediate member is faced to the second member in an axial direction and is unrotatable and axially movable with respect to the shaft. By an elastic member interposed between the shaft and the intermediate member, the intermediate member is urged towards the second member in the axial direction. The second member and the intermediate member are engaged with each other in a rotating direction by an engaging structure. The engaging structure releases the engagement with energization of the elastic member in response to a rotating force applied between the second member and the intermediate member.

13 Claims, 16 Drawing Sheets

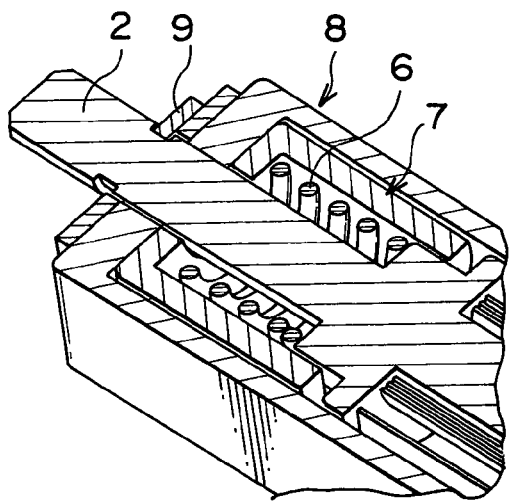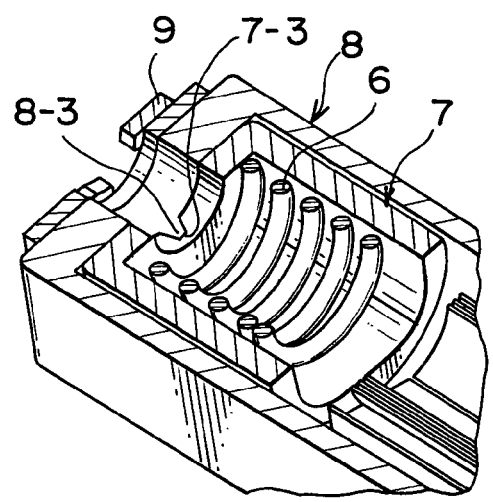
FIG. 16A  FIG. 16B
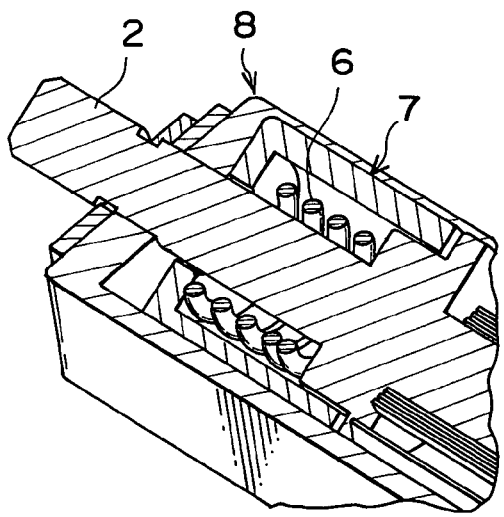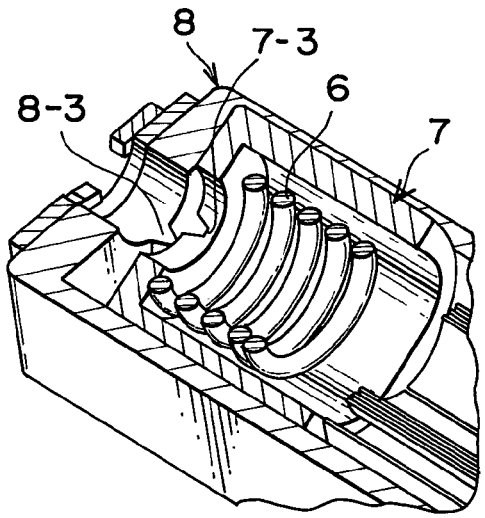
FIG. 16C  FIG. 16D

SIMPLE HINGE UNIT CAPABLE OF PROVIDING ELECTRICAL CONNECTION IN AN ELECTRONIC APPARATUS

This application claims priority to prior Japanese patent application JP 2003-328298, the disclosure of which is incorporated herein by reference.

BACKGROUND OF THE INVENTION

This invention relates to a hinge unit widely used in various fields.

For example, a hinge unit incorporated into a mobile telephone set is disclosed in Japanese patent publications (JP-B) Nos. 3145652 and 3220412. The hinge unit mechanically and rotatably connects an operating part and a display part of the mobile telephone set so that the display part can be opened, for example, to an angle of 180° with respect to the operating part. The display part and the operating part are electrically connected by a cable independently from the mechanical connection by the hinge unit.

However, the above-mentioned hinge unit is disadvantageous in that a large number of parts are required and assembling is complicated because the electrical connection and the mechanical connection between the operating part and the display part are separately provided.

SUMMARY OF THE INVENTION

It is therefore an object of this invention to provide a hinge unit requiring a reduced number of parts and simple in assembling.

Other object of the present invention will become clear as the description proceeds.

According to an aspect of the present invention, there is provided a hinge unit for use in an electronic apparatus, said hinge unit comprising a shaft, a first member holding a part of said shaft, said first member unrotatable and axially unmovable with respect to said shaft, a circuit board having a flexible portion wound around the other part of said shaft, a second member rotatable and axially unmovable with respect to said shaft, an intermediate member faced to said second member in an axial direction, said intermediate member being unrotatable and axially movable with respect to said shaft, an elastic member interposed between said shaft and said intermediate member and urging said intermediate member towards said second member in the axial direction, and an engaging structure engaging said second member and said intermediate member with each other in a rotating direction, said engaging structure releasing the engagement between said second member and said intermediate member with energization of said elastic member in response to a rotating force applied between said second member and said intermediate member.

BRIEF DESCRIPTION OF THE DRAWINGS

FIG. 16A is an enlarged perspective sectional view of the hinge unit when the camera module is in the initial state or in the 180°-rotated state;

FIG. 16B is an enlarged perspective sectional view similar to FIG. 16A except that the shaft is removed;

FIG. 16C is an enlarged perspective sectional view of the hinge unit when the camera module is rotated by about 20° from the initial state or the 180°-rotated state; and FIG. 16D is an enlarged perspective sectional view similar to FIG. 16C except that the shaft is removed.

DESCRIPTION OF THE PREFERRED EMBODIMENTS

Now, description will be made as regards a hinge unit according to an embodiment of this invention. The hinge unit can be used in a camera-equipped electronic apparatus.

Figure 1A:
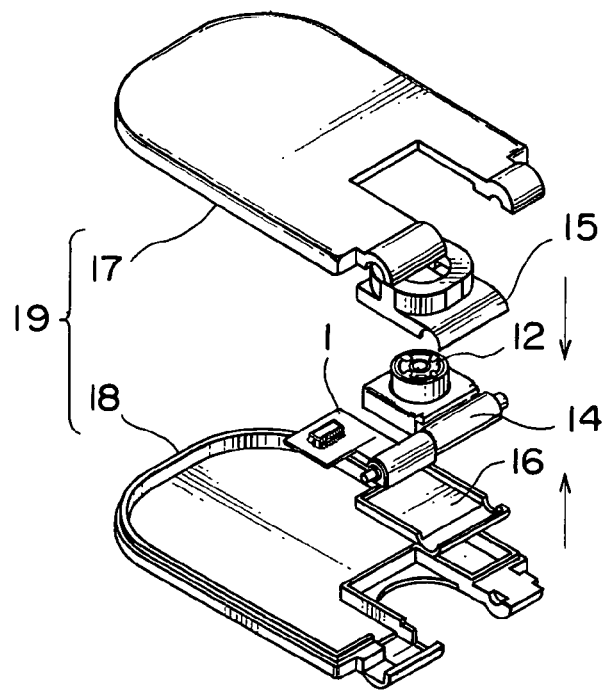
FIG. 1A is a perspective view for describing a first step of fitting, to an electronic apparatus, a hinge unit according to an embodiment of this invention.
Figure 1B:
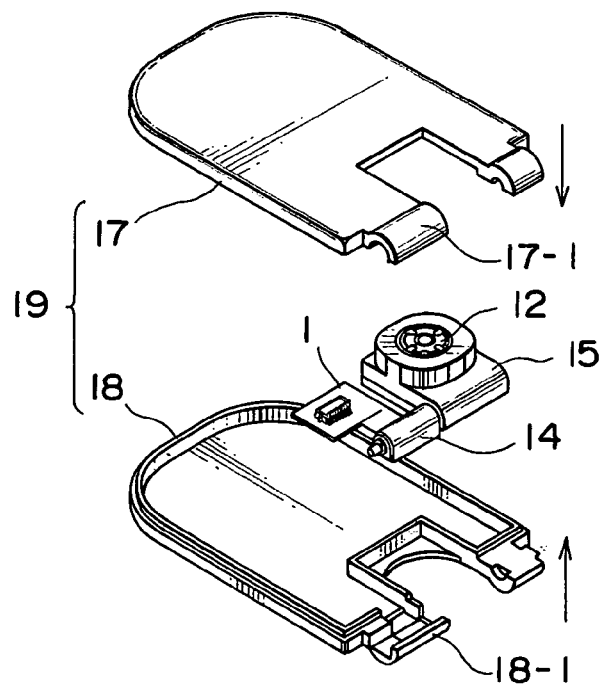
FIG. 1B is a perspective view of a second step of fitting the hinge unit to the electronic apparatus.

At first referring to FIGS. 1A, 1B, and 2A to 2D, the description will be made as regards a whole of the camera-equipped electronic apparatus in order to facilitate an understanding of this invention. Referring to FIGS. 1A and 1B, a camera module 12 as a first apparatus element is incorporated into an electronic apparatus 19 as a second apparatus element by the use of a hinge unit 14. As shown in FIG. 1A, the hinge unit 14 with the camera module 12 preliminarily attached thereto is clamped by an upper protector 15 and a lower protector 16 from upper and lower sides thereof, respectively. Next, as illustrated in FIG. 1B, the hinge unit 14 is clamped by upper and lower support portions 17-1 and 18-1 of upper and lower main bodies 17 and 18 of the electronic apparatus 19 from the upper and the lower sides thereof, respectively.

Figure 2A:
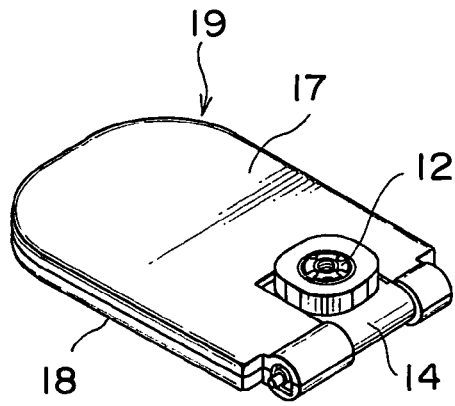
FIG. 2A is a front perspective view of the electronic apparatus with the hinge unit fitted thereto, wherein the electronic apparatus is in an initial state.
Figure 2B:
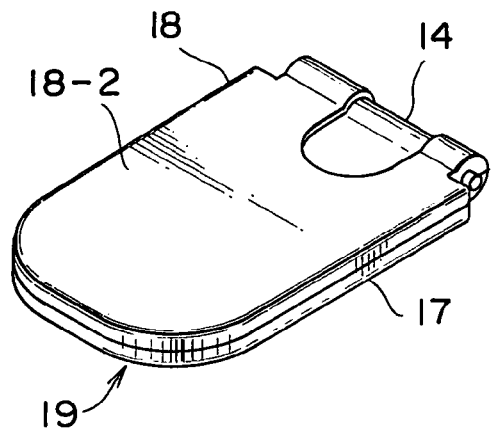
FIG. 2B is a rear perspective view corresponding to FIG. 2A.
Figure 2C:
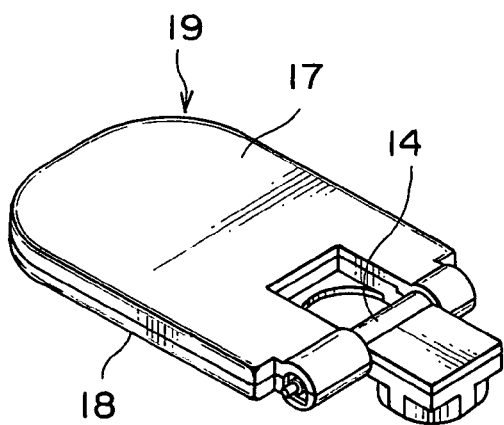
FIG. 2C is a front perspective view of the electronic apparatus with the hinge unit fitted thereto, wherein the electronic apparatus is in an operated state.
Figure 2D:
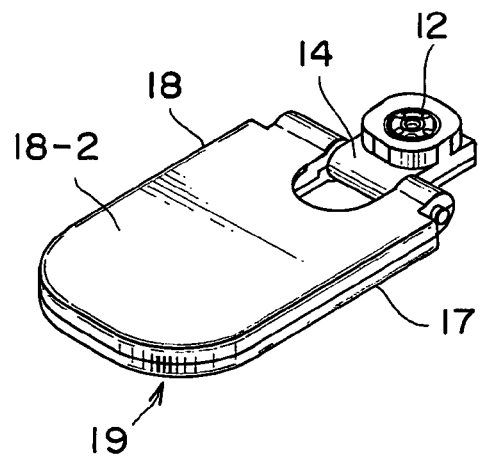
FIG. 2D is a rear perspective view corresponding to FIG. 2C.

In the above-mentioned manner, the camera module 12 is rotatably attached to the electronic apparatus 19 via the hinge unit 14 as illustrated in FIGS. 2A and 2B. In FIGS. 2C and 2D, the camera module 12 is rotated by 180°.

The lower main body 18 has a surface provided with a display portion, such as a LCD, and an operating portion 18-2. By manipulating the operating portion 18-2, a front view and a user himself can be photographed as an object in the state illustrated in FIGS. 2A and 2B and in the state illustrated in FIGS. 2C and 2D, respectively, while confirming the object at the display portion.

Figure 3:
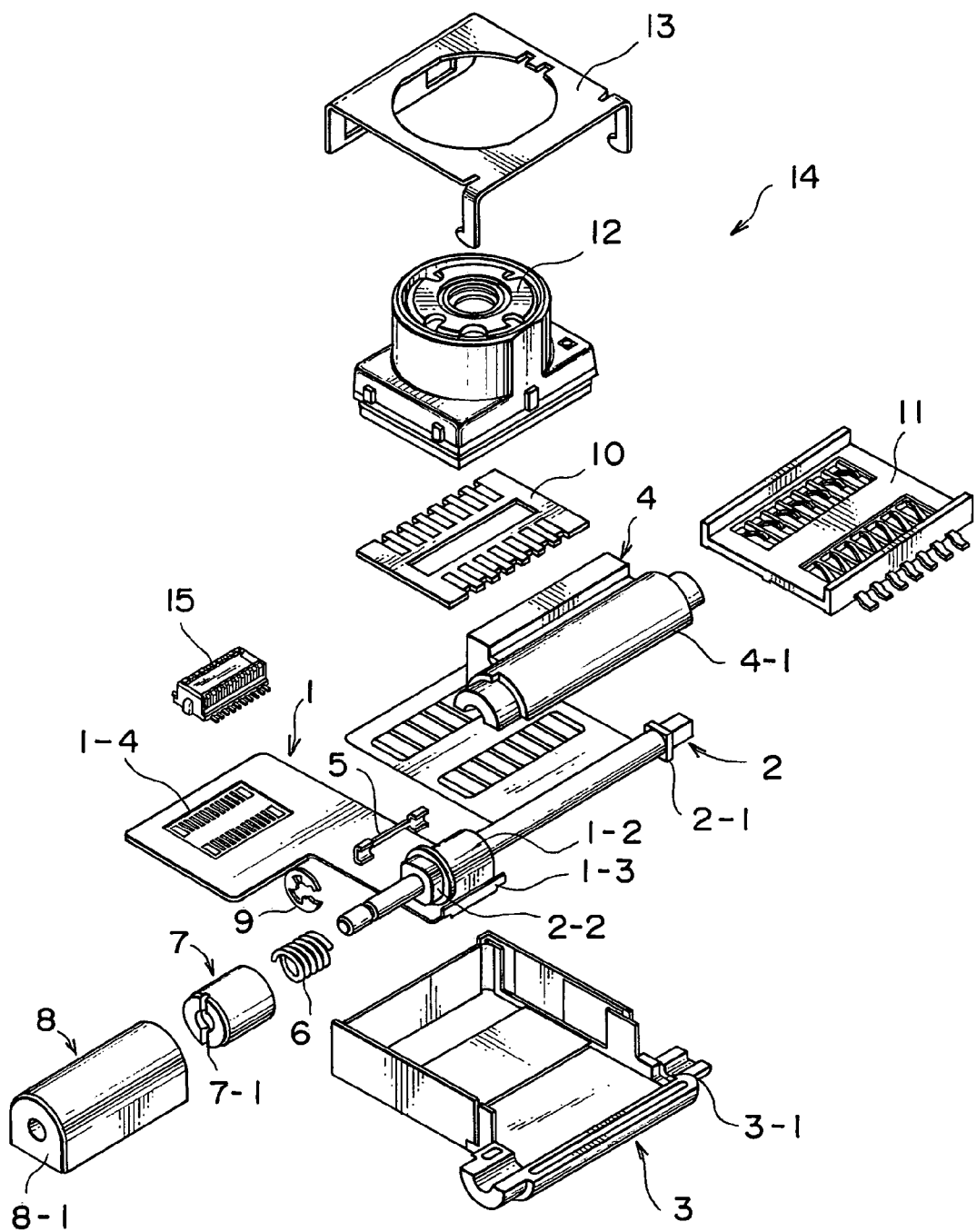
FIG. 3 is an exploded perspective view of the hinge unit and a camera module to be connected thereto.

Next referring to FIG. 3, various components of the hinge unit 14 will be described.

The hinge unit 14 comprises a flexible board (FPC) 1 as a circuit board, a shaft 2, a first shell element 3, a second shell element 4, a stopper 5, a coil spring 6, a cap 7, a third shell element 8, and a E-shaped snap ring 9. Assembling of the hinge unit 14 will later be described in detail.

To the hinge unit 14, press-connecting-type connectors 10 and 11, the camera module 12, a fitting metal 13, and a board-to-board connector 15 are combined. Thus, the hinge unit 14 with the camera module 12 preliminarily attached thereto is produced.

Figure 4A:
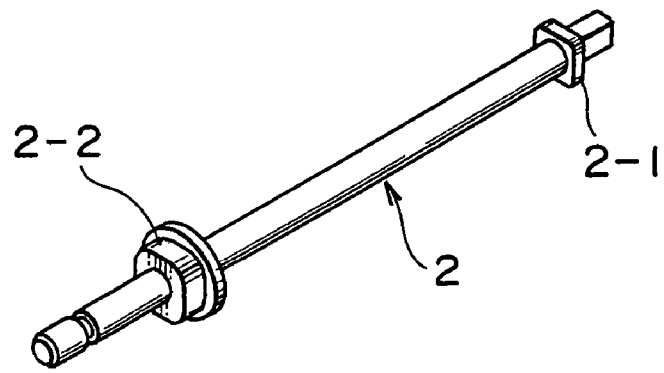
FIG. 4A is a perspective view of a shaft included in the hinge unit.

Referring to FIG. 4A, the shaft 2 has a first rotation stopper 2-1 having a rectangular flange-like shape and formed in the vicinity of one end of the shaft 2. The shaft 2 has a second rotation stopper 2-2 (which will later be described) formed at a distance from the other end of the shaft 2.

Figure 4B:
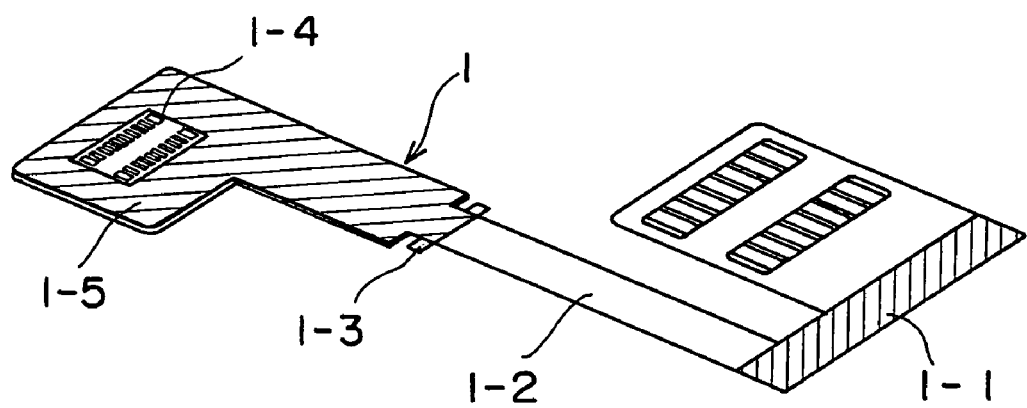
FIG. 4B is a perspective view of a circuit board (FPC) included in the hinge unit.

Referring to FIG. 4B, the flexible board 1 has a double-sided tape 1-1 preliminarily adhered to its one end. By the double-sided tape 1-1, the flexible board 1 is fixed to the shaft 2 between the first and the second rotation stoppers 2-1 and 2-2. The flexible board 1 further has a bendable portion 1-2 as a flexible portion, a fixed portion 1-3, a connector fitting portion 1-4, and a shield layer 1-5. The bendable portion 1-2 is wound around the shaft 2 in a plurality of turns.

Referring to FIGS. 5 to 12, description will be made of a series of assembling steps of an assembly of the camera module 12 and the hinge unit 14.

Figure 5:
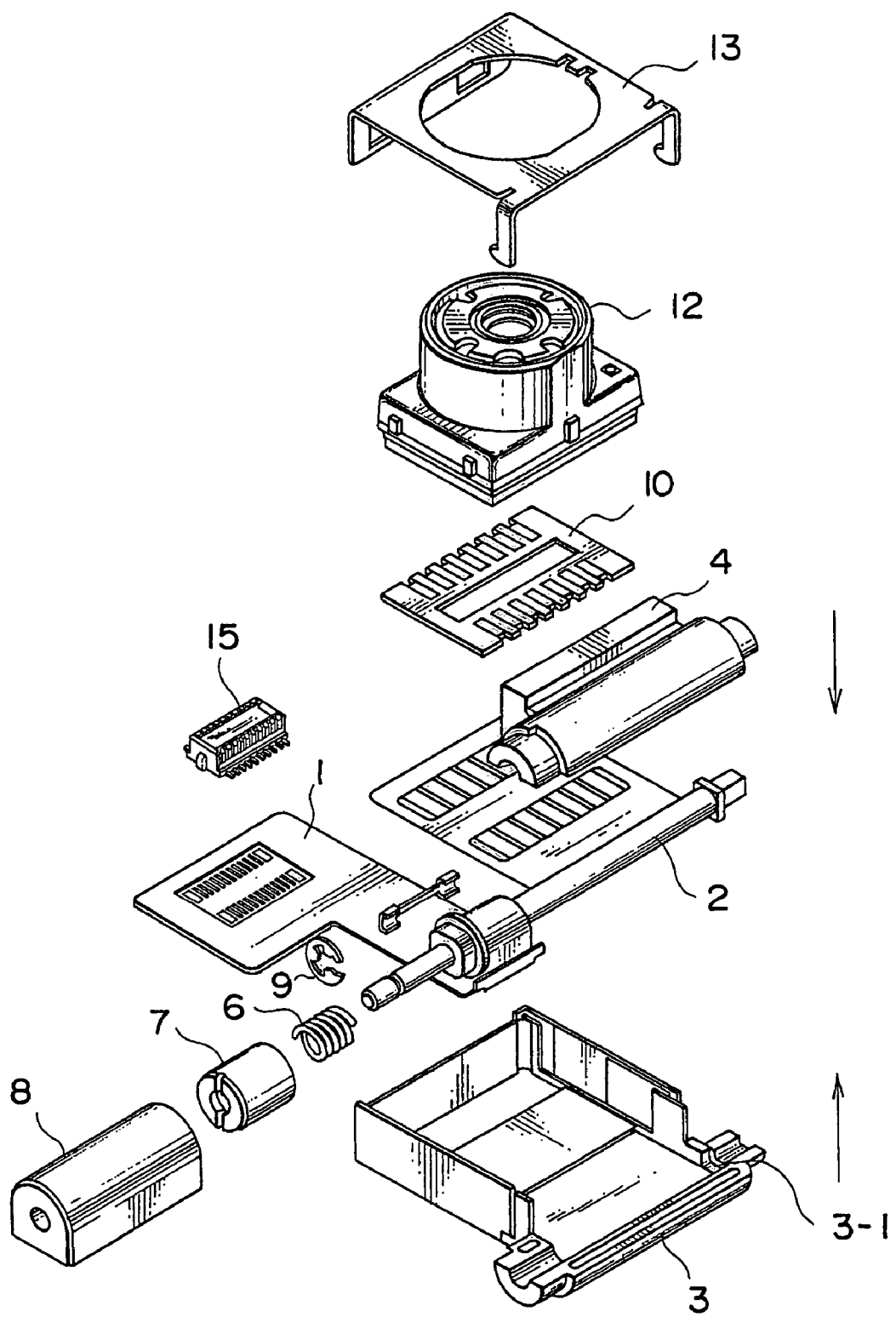
FIG. 5 is a perspective view for describing a first assembling step of the hinge unit.

At first, the shaft 2 with the FPC 1 wound around and fixed thereto is clamped and fixed by the first and the second shell elements 3 and 4 as depicted by arrows in FIG. 5. A combination of the first and the second shell elements 3 and 4 will be called a first member. The first member is provided with a rotation stopper 3-1. The rotation stopper 3-1 is engaged with the first rotation stopper 2-1 of the shaft 2 so that the first member is unrotatable with respect to the shaft 2. The first rotation stopper 2-1 of the shaft 2 is engaged with the first and the second shell elements 3 and 4 also in an axial direction so that the first member is axially unmovable with respect to the shaft 2.

Figure 6:
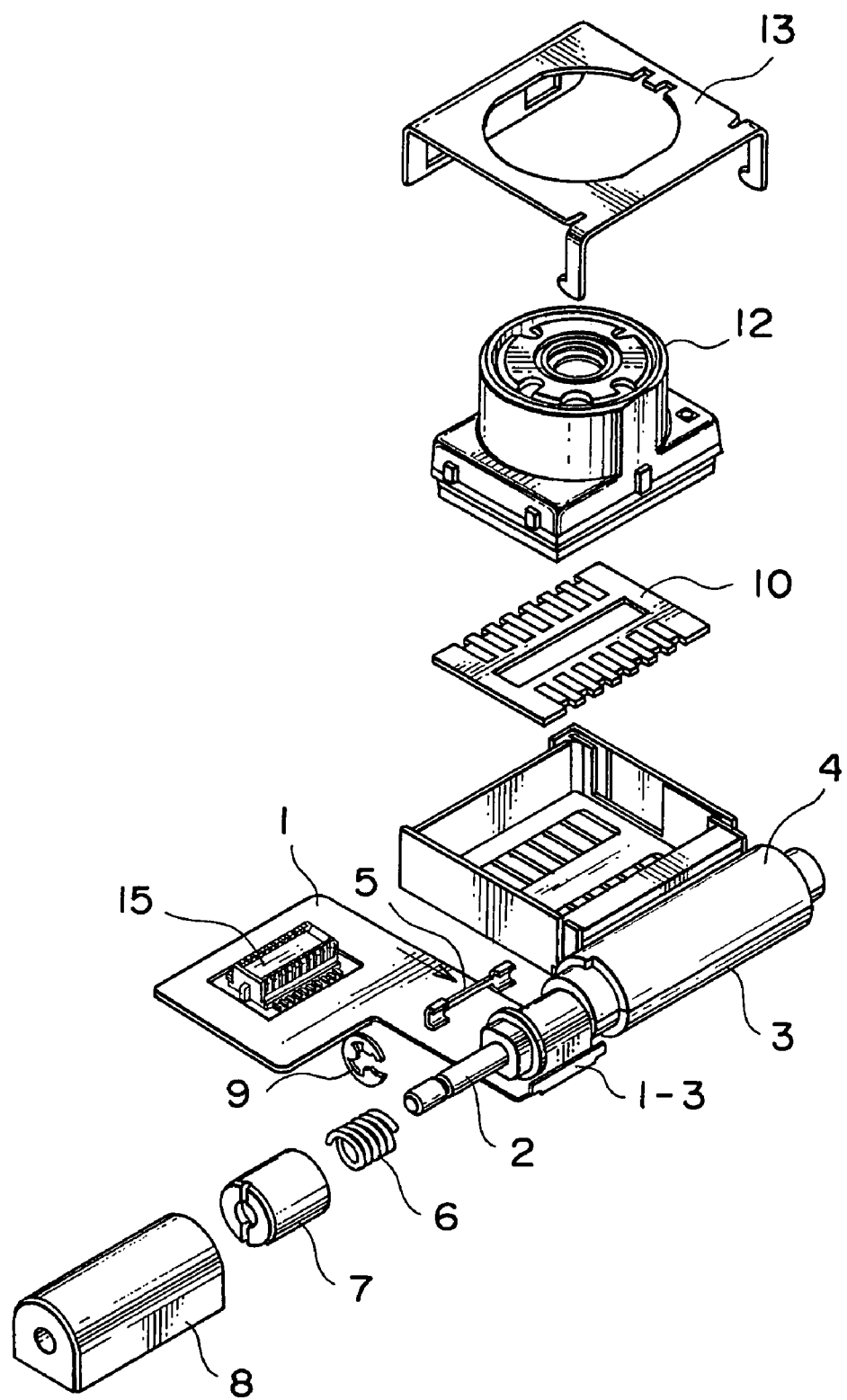
FIG. 6 is a perspective view for describing a second assembling step of the hinge unit.

The stopper 5 is attached to the fixing portion 1-3 of the FPC 1 as depicted by an arrow in FIG. 6. The board-to-board connector 15 is attached to the connector fitting portion 1-4 of the FPC 1. In most cases, the board-to-board connector 15 is preliminarily soldered and connected to the connector fitting portion 1-4 of the FPC 1 prior to the assembling steps.

Figure 7:
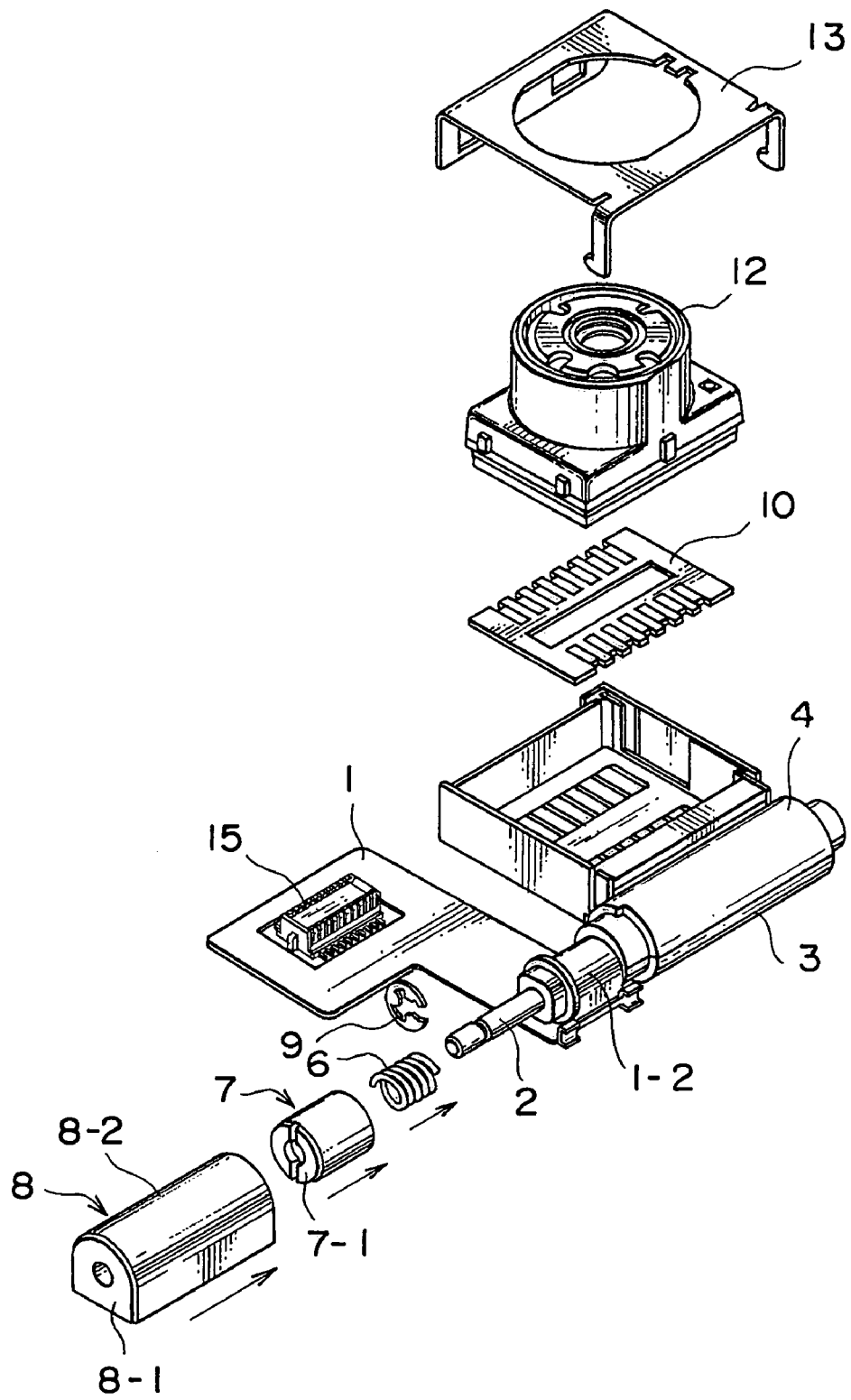
FIG. 7 is a perspective view for describing a third assembling step of the hinge unit.

To the shaft 2, the coil spring 6 as an elastic member, the cylindrical cap 7 as an intermediate member covering the coil spring 6, and the third shell element 8 of a tubular shape are successively attached as depicted by arrows in FIG. 7. Further, the E-shaped snap ring 9 is attached to the shaft 2 as depicted by an arrow in FIG. 8 so as to prevent the third shell element 8 from being released form the shaft 2. Thus, the third shell element 8 is rotatable and axially unmovable with respect to the shaft 2. Therefore, the third shell element 8 is rotatable with respect to the first member comprising the first and the second shell elements 3 and 4. The third shell element 8 may be called a second member.

Figure 8:
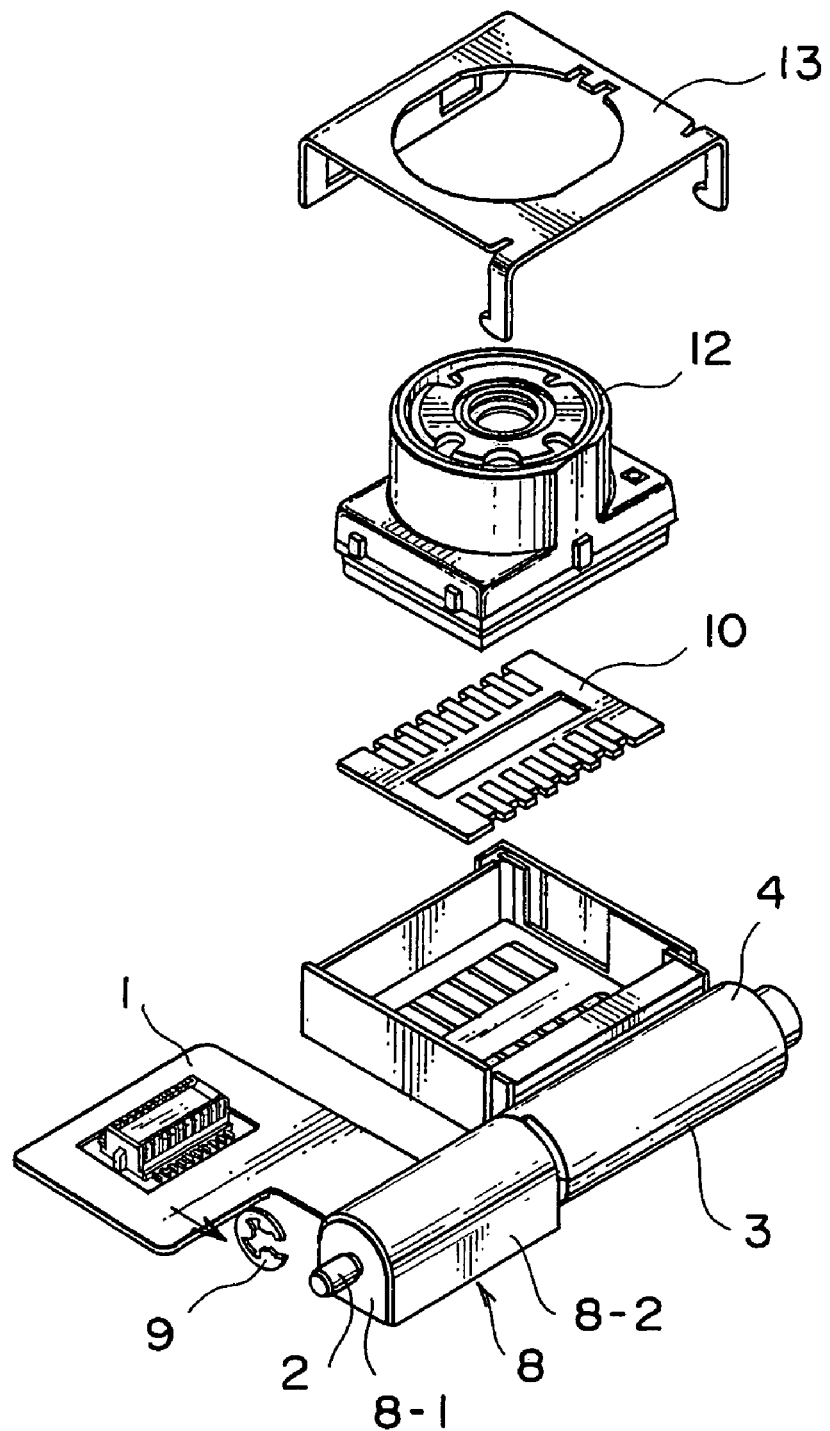
FIG. 8 is a perspective view for describing a fourth assembling step of the hinge unit.

Referring to FIGS. 7 and 8 in combination, the cap 7 is inserted into the interior of the third shell element 8. The coil spring 6 is disposed inside the cap 7. The cap 7 is provided with an inward flange 7-1 formed at a first axial end thereof. The coil spring 6 is interposed between the inward flange 7-1 and the second rotation stopper 2-2 in a compressed state. In this state, the cap 7 is urged by a restoring force of the coil spring 6 towards an axial end plate 8-1 which is provided at a first axial end of the third shell element 8. The third shell element 8 has a cover portion 8-2 extending in the axial direction so as to cover not only the cap 7 and the coil spring 6 but also the bendable portion 1-2 of the flexible board 1.

Figure 9:
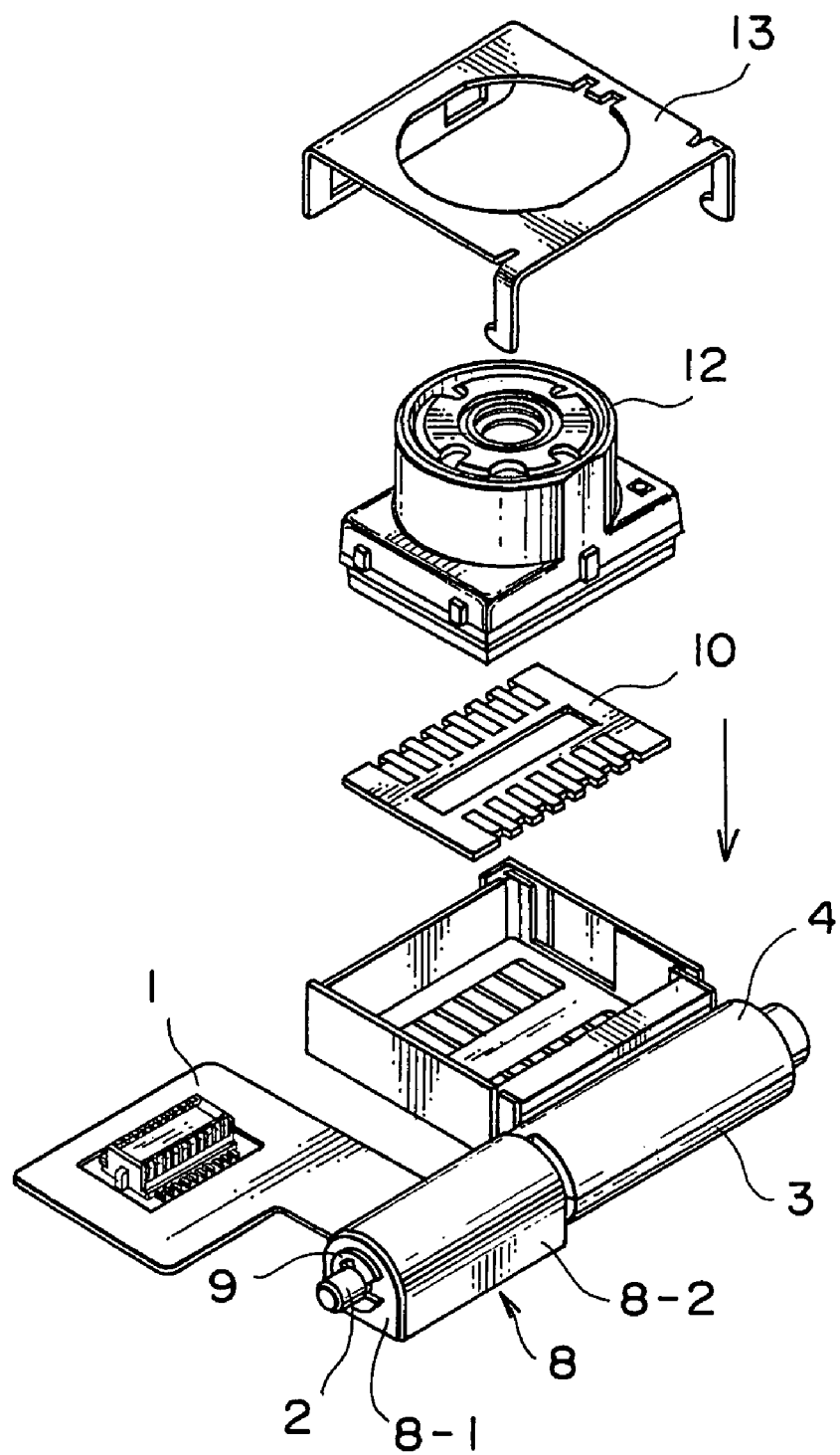
FIG. 9 is a perspective view for describing a fifth assembling step of the hinge unit.
Figure 10:
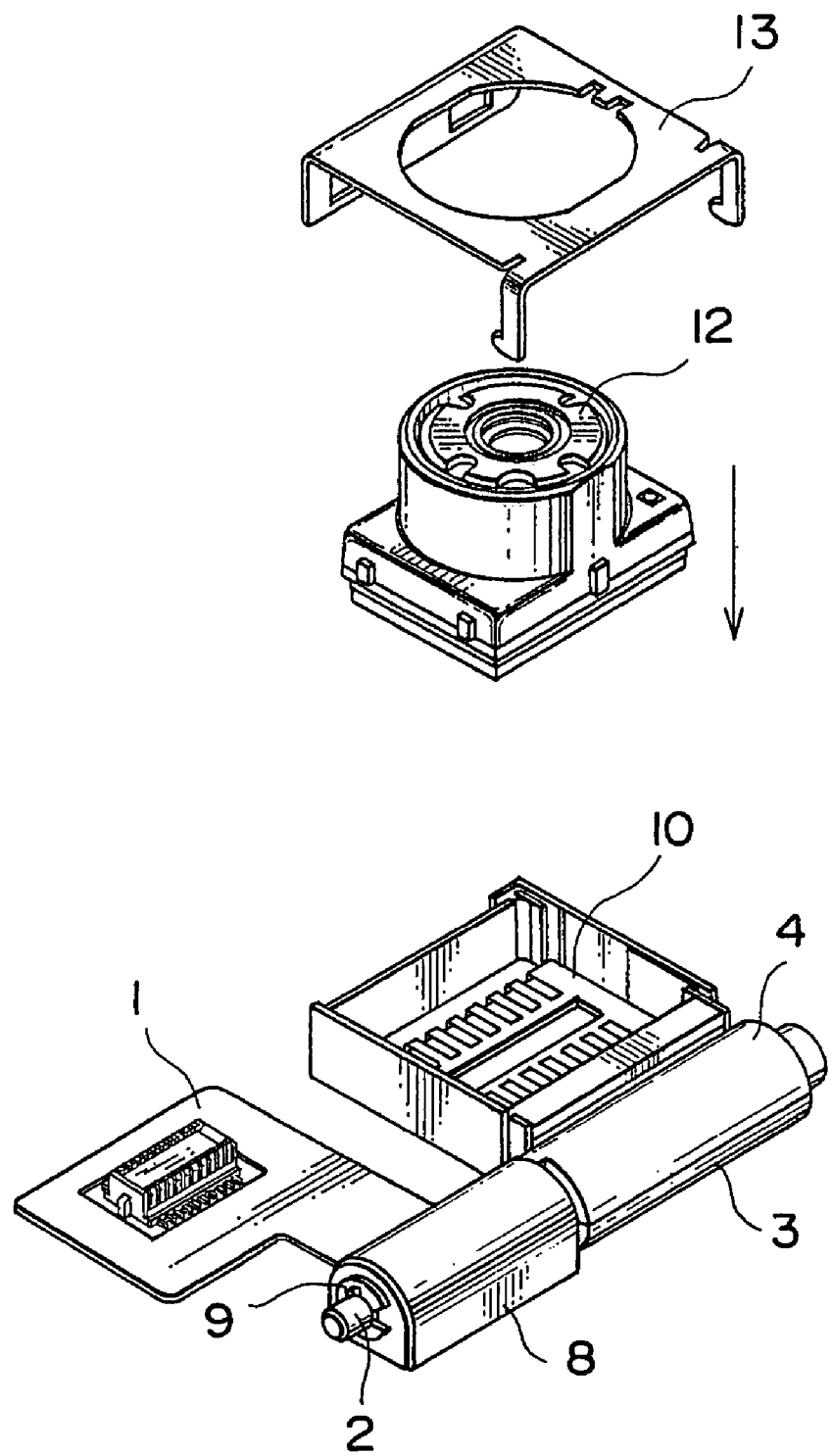
FIG. 10 is a perspective view for describing a sixth assembling step of the hinge unit.

As depicted by an arrow in FIG. 9, the press-connecting-type connector 10 is inserted into the first shell element 3. At this time, the press-connecting-type connector 11 of a different type illustrated in FIG. 3 may be used. Thereafter, the camera module 12 is inserted into the first shell element 3 as depicted by an arrow in FIG. 10.

Figure 11:
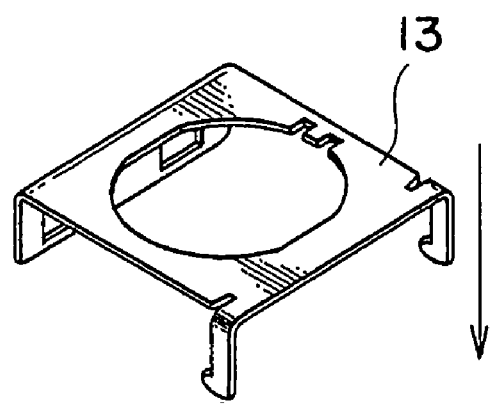
FIG. 11 is a perspective view for describing a seventh assembling step of the hinge unit.
Figure 11:
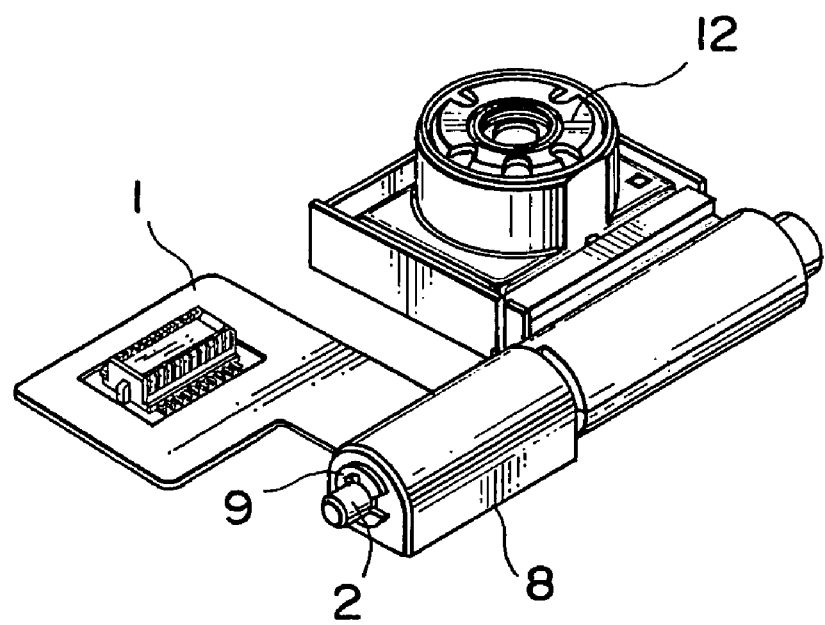
Figure 12:
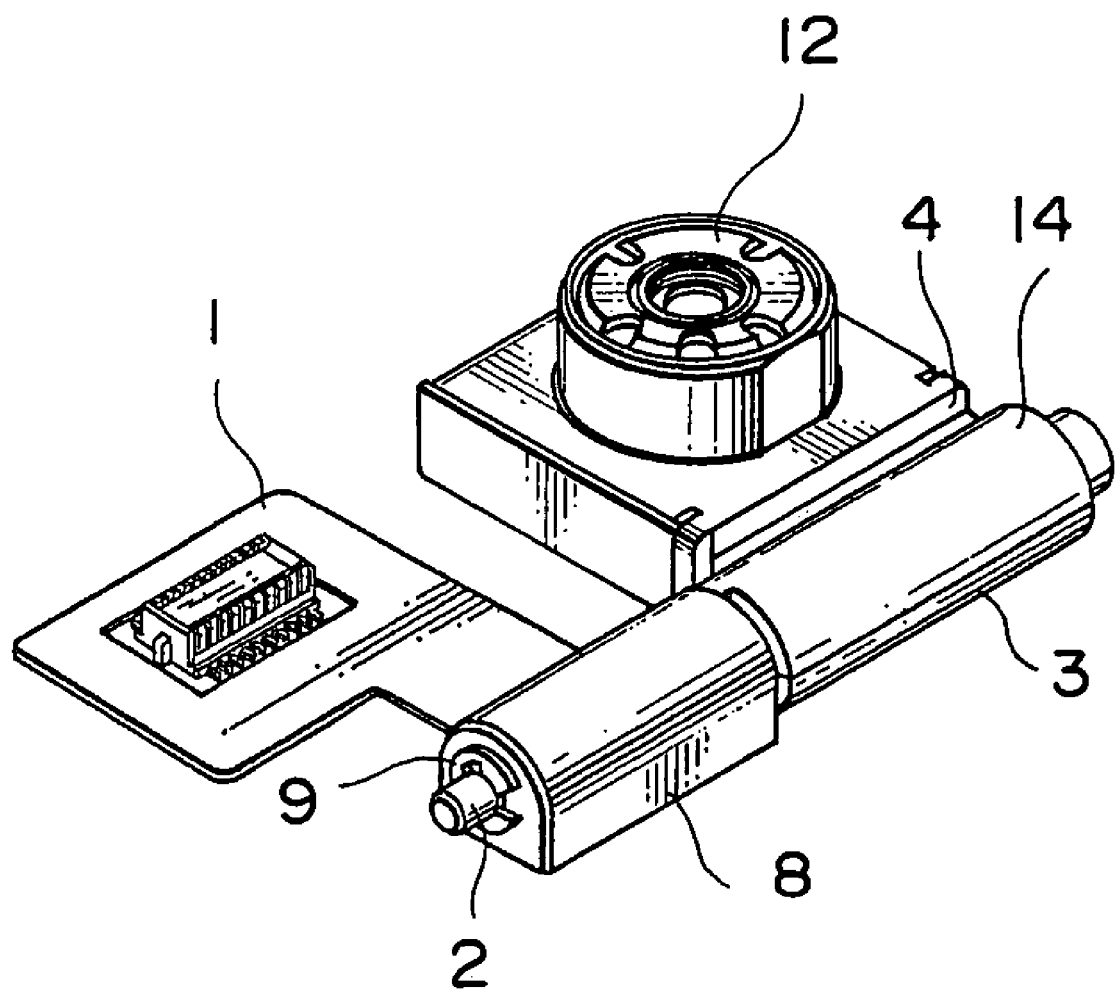
FIG. 12 is a perspective view of the hinge unit after completion of the assembling steps.

Finally, as depicted by an arrow in FIG. 11, the fixing metal 13 is attached to the first shell element 3. Thus, the hinge unit 14 with the camera module 12 is completed as illustrated in FIG. 12.

Further referring to FIGS. 13A to 13D, 14A, and 14B, description will be made of a detailed structure of the hinge unit 14.

Figure 13A:
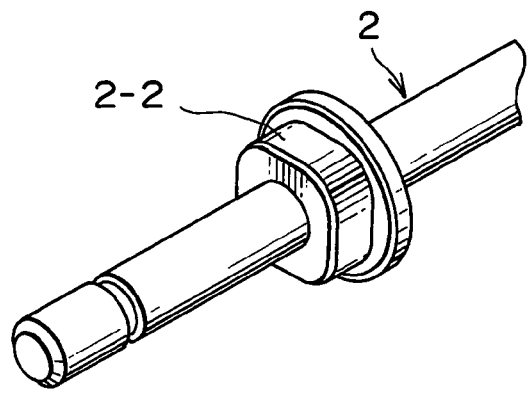
FIG. 13A is an enlarged perspective view of a part of the shaft illustrated in FIG. 4A.
Figure 13B:
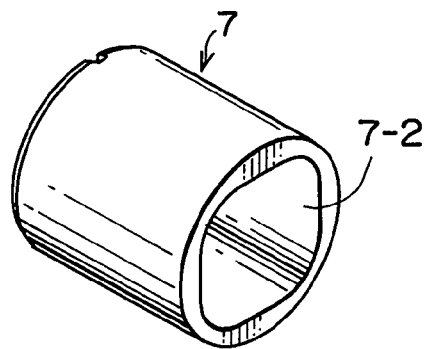
FIG. 13B is an enlarged perspective view of a cap included in the hinge unit, as seen from one side.

The second rotation stopper 2-2 of the shaft 2 is formed into a non-circular flange-like shape as illustrated in FIG. 13A. The cap 7 is provided with a mating rotation stopper 7-2 formed on an inner surface of an opening which is opened at a second axial end of the cap 7. The mating rotation stopper 7-2 has a non-cylindrical surface substantially equivalent to an outer peripheral surface of the second rotation stopper 2-2 of the shaft 2. The mating rotation stopper 7-2 of the cap 7 is snuggly fitted over the second rotation stopper 2-2 of the shaft 2 so that the cap 7 is unrotatable and axially movable with respect to the shaft 2.

Figure 13C:
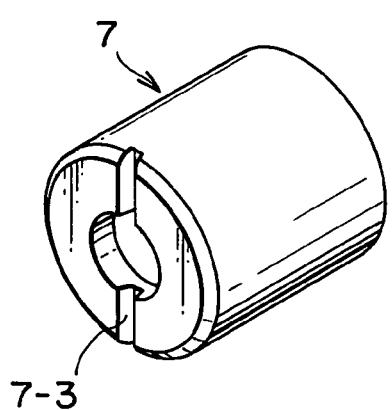
FIG. 13C is an enlarged perspective view of the cap as seen from the other side.

As illustrated in FIG. 13C, the cap 7 is provided with the inward flange 7-1 formed at the first axial end as described above. The inward flange 7-1 has an outer surface provided with a depressed portion 7-3 extending in a radial direction. The depressed portion 7-3 is defined by a pair of side walls inclined so that an opening of the depressed portion 7-3 is wider than a bottom thereof in section.

Figure 13D:
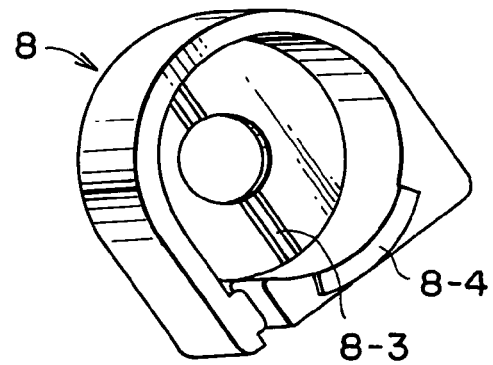
FIG. 13D is an enlarged perspective view of a third shell element included in the hinge unit.

On the other hand, as illustrated in FIG. 13D, the axial end plate 8-1 of the third shell element 8 is provided with a protruding portion 8-3 formed on its inner surface and extending in the radial direction. The protruding portion 8-3 has a shape adapted to be substantially tightly fitted to the depressed portion 7-3 in the axial direction. When fitted to each other, the protruding portion 8-3 and the depressed portion 7-3 form an engaging structure for engaging the third shell element 8 and the cap 7 with each other in a rotating direction. When a rotating force not smaller than a predetermined value is applied between the third shell element 8 and the cap 7, the engaging structure releases the engagement between the third shell element 8 and the cap 7 with energization of the coil spring 6, as will later be described in detail. In order to provide the rotating force, the third shell element 8 has an outer peripheral surface of a non-circular shape and is prevented from rotation with respect to the electronic apparatus.

Figure 14A:
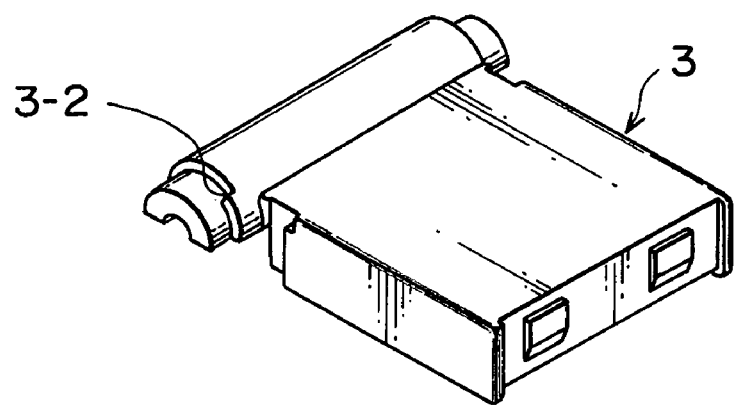
FIG. 14A is an enlarged perspective view of a first shell element included in the hinge unit.
Figure 14B:
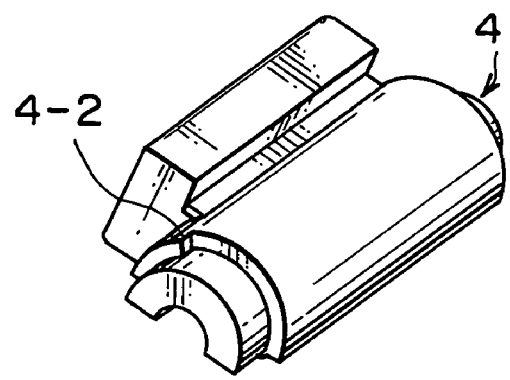
FIG. 14B is an enlarged perspective view of a second shell element included in the hinge unit.

The third shell element 8 is provided with a stopper 8-4 at a second axial end thereof as shown in FIG. 13D. As shown in FIGS. 14A and 14B, the first and the second shell elements 3 and 4 are provided with stoppers 3-2 and 4-2 which limit a rotation angle of the third shell element 8 in cooperation with the stopper 8-4, By selecting locations of the stoppers 3-2, 4-2, and 8-4, the rotation angle can be changed. Herein, the rotation angle is set at 180°.

Figure 15A:
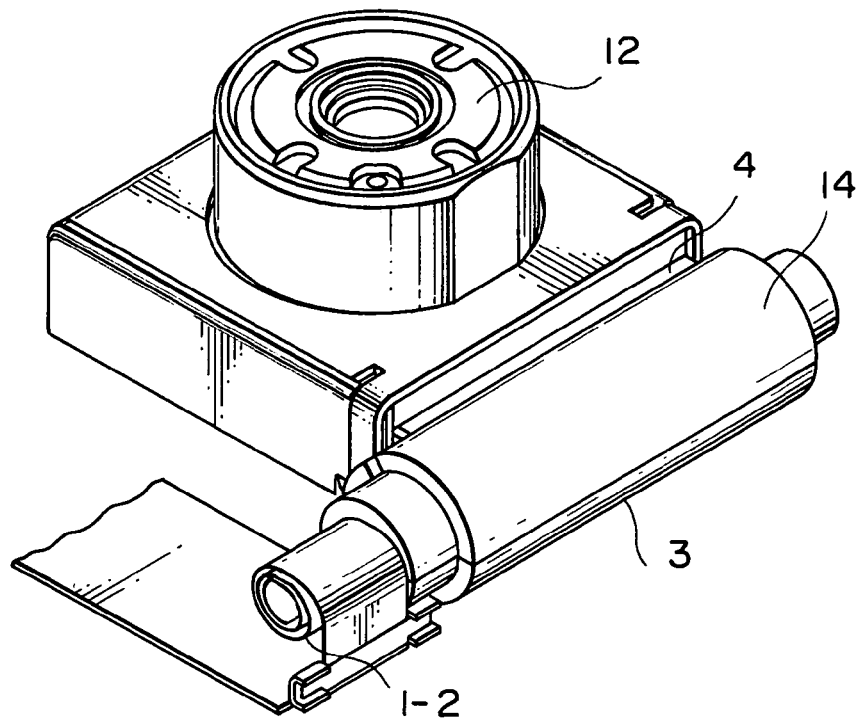
FIG. 15A is an enlarged perspective view showing a relaxed state of a flexible part of the FPC when the camera module is in an initial state.
Figure 15B:
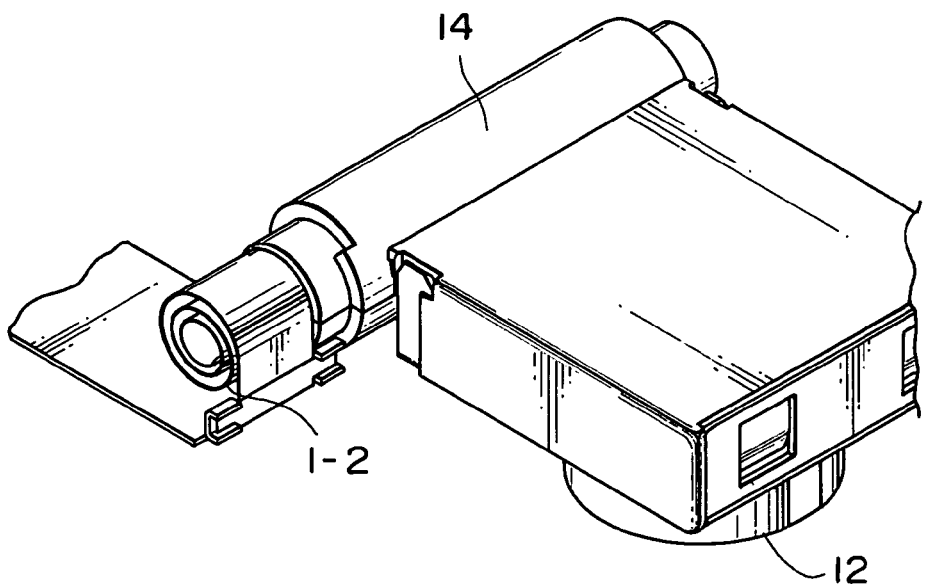
FIG. 15B is an enlarged perspective view showing a stretched state of the flexible part of the FPC when the camera module is in a 180°-rotated state.

Referring to FIG. 15A, the camera module 12 is in an initial state (i.e., the camera module 12 is received in an inner space, in other words, the camera module 12 is held at a front view photographing position). Referring to FIG. 15B, the camera module 12 is rotated by 180° (i.e., the camera module 12 is protruded, in other words, the camera module 12 is held at a self image photographing position). In FIG. 15A, the bendable portion 1-2 of the FPC 1 is relaxed. In FIG. 15B, the bendable portion 1-2 is stretched.

Referring to FIG. 16A, a rotation brake portion and a click portion are shown in the state where the camera module 12 is in the initial state or the 180°-rotated state. In FIG. 16B, the shaft 2 is removed from the state in FIG. 16A. In FIG. 16C, the rotation brake portion and the click portion are shown in the state where the camera module 12 is rotated by about 20° from the initial state or the 180°-rotated state. In FIG. 16D, the shaft 2 is removed from the state in FIG. 16C.

In the states illustrated in FIGS. 16A and 16B, the protruding portion 8-3 formed inside the third shell element 8 and the depressed portion 7-3 of the cap 7 are fitted to each other. Since the first shell element 3 is fixed to the shaft 2, the shaft 2 is rotated when the camera module 12 is rotated. Since the cap 7 is inhibited from rotation with respect to the shaft 2, the cap 7 is rotated together with the shaft 2. However, the cap 7 is slidable in the axial direction. Therefore, as illustrated in FIGS. 16C and 16D, when the cap 7 starts rotation following the rotation of the shaft 2, the depressed portion 7-3 of the cap 7 is disengaged from the protruding portion 8-3 of the third shell element 8. Further, the cap 7 is moved in the axial direction away from the axial end plate 8-1 of the third shell element 8 to press the coil spring 6 against the second rotation stopper 2-2 of the shaft 2. Therefore, a frictional resistance produced between the coil spring 6 and the second rotation stopper 2-2 serves as a rotation brake so that the camera module 12 is prevented from being rotated due to its weight. In this event, a combination of the coil spring 6 and the second rotation stopper 2-2 will be referred to as the rotation brake portion.

Returning from the state illustrated in FIGS. 16C and 16D to the state illustrated in FIGS. 16A and 16B, the depressed portion 7-3 of the cap 7 is faced to the protruding portion 8-3 of the third shell element 8 and the cap 7 is pushed back by the coil spring 6. As a consequence, the depressed portion 7-3 of the cap 7 is fitted again over the protruding portion 8-3 of the third shell element 8. At this time, appropriate click feeling is obtained. In this event, a combination of the coil spring 6, the depressed portion 7-3, and the protruding portion 8-3 will be referred to as the click portion.

In this state also, the coil spring 6 is not unloaded but compressed. The camera module 12 is kept in the initial state or the 180°-rotated state by a force which is required for the depressed portion 7-3 of the cap 7 to move across the protruding portion 8-3 of the third shell 8.

As will presently be described, the above-mentioned hinge unit 14 may easily be provided with EMC protection. Specifically, a shell forming member, such as the first, the second, and the third shell elements 3, 4, 8, is made of a metal or a resin with a metal film formed on its surface. On the other hand, as shown in FIG. 4B, the FPC 1 is provided with a shield layer 1-5 of conductive material at a portion exposed outward from the shell forming member. The shield layer 1-5 continuously extends to the fixing portion 1-3 and electrically connected to the shell forming member. With this structure, the bendable portion 1-2 of the FPC 1 requires no shield layer. Therefore, the FPC 1 can be reduced in thickness so that an appropriate flexibility or bendability is maintained.

While this invention has thus far been described in connection with the preferred embodiment thereof, it will be readily possible for those skilled in the art to put this invention into practice in various other manners without departing from the scope set forth in the appended claims. In the foregoing, the hinge unit with the camera module has been described. Alternatively, board-to-board connectors may be mounted on opposite ends of the FPC without mounting the camera module. In this case, the other end of the FPC has a similar structure. The hinge unit is applicable not only to the camera-equipped electronic apparatus but also to various other electronic apparatuses such as a mobile telephone, a personal digital assistant (PDA), and a notebook-type personal computer.

What is claimed is:

1. A hinge unit for use in an electronic apparatus, said hinge unit comprising:

a shaft which comprises a first part, a first rotation stopper, and a second part that is positioned between the first part and the first rotation stopper in an axial direction of said shaft;

a first member which holds the first part of said shaft, wherein said first member is not rotatable and is not axially movable with respect to said shaft, and said first member cooperates with the first rotation stopper to define a space between said first member and the first rotation stopper of said shaft along the axial direction of said shaft;

a circuit board which comprises a flexible portion which is wound around the second part of said shaft in the space, wherein the flexible portion has an end which is fixed to the second part of said shaft;

a second member which is rotatable in a rotating direction with respect to said shaft, and which is not axially movable with respect to said shaft;

an intermediate member which is faced to said second member in the axial direction, wherein said intermediate member is not rotatable with respect to the first rotation stopper of said shaft and is axially movable with respect to said shaft;

an elastic member which is interposed between said shaft and said intermediate member, and which urges said intermediate member towards said second member in the axial direction; and an engaging structure which engages said second member and said intermediate member with each other in the rotating direction, wherein said engaging structure releases the engagement between said second member and said intermediate member, and said elastic member is energized, in response to a rotating force applied between said second member and said intermediate member.

2. The hinge unit according to claim 1, wherein said engaging structure comprises a depressed portion in said intermediate member and a protruding portion formed on said second member to be fitted to said depressed portion in the axial direction.

3. The hinge unit according to claim 1, wherein said first member comprises a first shell element and a second shell element connected to said first shell element, and said shaft is held between said first and said second shell elements.

4. The hinge unit according to claim 3, further comprising a second rotation stopper which engages said shaft and said first and said second shell elements with each other in the rotating direction.

5. The hinge unit according to claim 1, wherein said second member comprises a cover portion which extends in the axial direction to cover said flexible portion.

6. The hinge unit according to claim 1, wherein said intermediate member has a cylindrical shape and is fitted around said shaft to be axially movable with respect to said shaft, and
wherein said first rotation stopper engages said shaft and said intermediate member with each other in the rotating direction.

7. The hinge unit according to claim 6, wherein said first rotation stopper protrudes around said shaft, and said elastic member is interposed between said first rotation stopper and said intermediate member in the axial direction.

8. The hinge unit according to claim 7, wherein said elastic member comprises a compression coil spring.

9. The hinge unit according to claim 8, wherein said intermediate member comprises an inward flange, and said compression coil spring is interposed between said first rotation stopper and said inward flange in a compressed state.

10. The hinge unit according to claim 9, wherein said second member comprises a cover portion which covers said intermediate member, said compression coil spring, and said flexible portion.

11. The hinge unit according to claim 10, wherein said first and said second members have a conductive structure.

12. An electronic apparatus comprising:
the hinge unit according to claim 1;
a first apparatus element connected to said first member; and
a second apparatus element connected to said second member.

13. The electronic apparatus according to claim 12, wherein said first apparatus element comprises a camera module.

* * * * *